US007092598B2

(12) United States Patent
Evans

(10) Patent No.: US 7,092,598 B2
(45) Date of Patent: Aug. 15, 2006

(54) CHIP-SCALE WDM SYSTEM USING GRATING-OUTCOUPLED SURFACE-EMITTING LASERS

(75) Inventor: Gary A. Evans, Plano, TX (US)

(73) Assignee: Photodigm, Inc., Richardson, TX (US)

( * ) Notice: Subject to any disclaimer, the term of this patent is extended or adjusted under 35 U.S.C. 154(b) by 347 days.

(21) Appl. No.: 10/682,562

(22) Filed: Oct. 9, 2003

(65) Prior Publication Data

US 2005/0078728 A1    Apr. 14, 2005

(51) Int. Cl.
*G02B 6/34*  (2006.01)
*H04J 14/02* (2006.01)
*H01S 3/08*  (2006.01)

(52) U.S. Cl. ............................ 385/37; 385/15; 385/16; 385/130; 385/14; 385/131; 385/132; 372/92; 372/98; 372/43.01; 398/79; 398/83; 398/87

(58) Field of Classification Search .................... 385/1, 385/2, 3, 14, 15, 16, 17, 18, 37, 129, 130, 385/131, 132; 372/43.01, 92, 96, 97, 98, 372/99, 102; 398/79, 83, 87
See application file for complete search history.

U.S. PATENT DOCUMENTS

| 4,006,432 | A |   | 2/1977 | Streifer et al. | 331/94.5 C |
| 4,894,833 | A | * | 1/1990 | Carlin | 372/44.01 |
| 4,919,507 | A |   | 4/1990 | Evans et al. | 350/96.19 |
| 4,958,357 | A |   | 9/1990 | Kinoshita | 372/96 |
| 5,673,284 | A |   | 9/1997 | Congdon et al. | 372/50 |
| 5,748,811 | A | * | 5/1998 | Amersfoort et al. | 385/15 |
| 5,809,184 | A | * | 9/1998 | Doerr et al. | 385/11 |
| 5,915,051 | A | * | 6/1999 | Damask et al. | 385/16 |
| 5,970,081 | A |   | 10/1999 | Hirayama et al. | 372/96 |
| 6,028,881 | A | * | 2/2000 | Ackerman et al. | 372/75 |
| 6,064,783 | A |   | 5/2000 | Congdon et al. | 385/15 |

OTHER PUBLICATIONS

"Surface Emitting Semiconductor Lasers and Arrays", Ed. Evans and Hammer, Academic Press, 1993.
"Optimized Couplers Between Junction Lasers and Single Mode Fibers", Hammer, Neil, RCA Laboratories, Princeton, NJ, Final Report, Aug. 31, 1981-Jan. 31, 1983.
"Observations and Theory of High Power Butt Coupling to $LiNbO^3$-type Waaveguides", Hammer and Neil, IEEE J. Quantum Electronics, QE-18, 1751-1758, Oct. 1982.
"Bow-Tie Surface Emitting Lasers", Bedford, R., Luo, H., Fallahi, M., IEEE Photonics Tech. Let., vol. 12, No. 8, Aug. 2000.
"Surface-Emitting Distributed Feedback Quantum-Cascade Lasers", Schrenk, W. et al., Applied Physics Letters, vol. 77, No. 14, Oct. 2, 2000.
"Analysis of Grating Surface Emitting Lasers", Noll, R.J., Macomber, S.H., IEEE Journal of Quantum Electronics, vol. 26, No. 3, Mar. 1990.
"Faceless Bragg Reflector Surface-Emitting AlGaAs/GaAs Lasers Fabricated by Electron-Beam Lithography and Chemically Assisted Ion-Beam Etching", Tiberio, R.C., et al., J.Vac.Sci.Technol. B9 (6), Nov./Dec. 1991.

(Continued)

*Primary Examiner*—Brian M. Healy
(74) *Attorney, Agent, or Firm*—Duke W. Yee; Theodore D. Fay, III

(57) ABSTRACT

A surface emitting semiconductor laser system having an outcoupling aperture on a central waveguide. At either end of the central waveguide are means for reflecting a plurality of different wavelengths of light such that multiple wavelengths are outcoupled through a single outcoupling aperture. Means are provided by which the different wavelengths can be independently modulated.

21 Claims, 7 Drawing Sheets

OTHER PUBLICATIONS

"Laser Diode End Fire Coupling into Ti:LiNbO$_3$ Waveguides", Burns, Appl, Optics, 18, 2536-2537, Aug. 1979.

"Research Toward Optical Fiber Transmission Systems Part 1, Miller et al.," Proc. IEEE, 61, 1703-1751, Dec. 1973.

Stoll, "Distributed Bragg Deflector: A Multifunctional Integrated Optical Device", Applied Optics, vol. 17, No. 16, Aug. 15, 1978, pp. 2562-2569.

Evans et al., "Progress Toward a Monolithically Integrated Coherent Diode Laser Array", The Aerospace Corp., El Segundo, CA 90245, Interim Report, Feb. 20, 1981, 204 pages.

Saito et al., "16-ch Arrayed Waveguide Grating Module with 100-GHz Spacing", Furukawa Review, No. 19, 2000, pp. 47-52.

Parker et al., "2:1 Arrayed-Waveguide Grating Based WDM Access Networks: An Evolutionary Multi-Gb/s Upgrade Path", Fujitsu Telecommunications Europe Ltd., Abstract, pp. 1-8.

He et a., "Design, Simulation and Fabrication for Integrated DWDM Devices", Joint Research Lab for Optical Communication of Zhejiang University, Centre for Optical and Electromagnetic Research, Zhejiang University, Abstract, pp. 1-4.

Toda et al., "A Demultiplexing Scheme Using an Arrayed-Waveguide Grating for a DWDM MM-Wave Fiber-Radio System by Optical Frequency Interleaving", Graduate School of Engineering, Osaka University, Japan, Abstract, pp. 1-4.

Gehler et al., "Crosstalk Reduction of Arrayed Waveguide Gratings by UV Trimming of Individual Waveguides without H2-Loading", Alcatel Corporate Research Center, Technical University Hamburg-Harburg, Abstract, 1 page.

Ramaswami et al., "All-Optical Networks May One Day Form National Backbone", OE Reports, 2000 SPIE, pp. 1-5.

Hasegawa et al., "Development of a Heater-Control AWG Module", Furukawa Review No. 22, 2002, pp. 1-5.

Kim et al, "Fabrication of InP-Based Reflection Type Arrayed Waveguide Grating with Metal Coated Reflection Facet", Jpn. J. Appl. Phys. vol. 40 (2001), pp. L36-L37.

* cited by examiner

CHIP-SCALE WDM SYSTEM USING GRATING-OUTCOUPLED SURFACE-EMITTING LASERS

BACKGROUND OF THE INVENTION

1. Technical Field

The present invention generally relates to semiconductor lasers, and particularly to surface emitting semiconductor lasers capable of emitting and modulating a plurality of signals from the same outcoupling aperture.

2. Description of Related Art

Transmission of light through waveguides has been pursued for many types of communications applications. Light signals offer many potential advantages over electronic signals. Light sources are commonly created from semiconductor devices, and include semiconductor devices such as LEDs (Light Emitting Diodes) and LDs (Laser Diodes).

Optical fiber is the most commonly used transmission medium for light signals. A single fiber is capable of carrying several different modulated signals within it at one time. For instance, wavelength division multiplexing divides the used bandwidth of the fiber into different channels (each channel containing a small range of wavelengths) and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRs) located outside the pumped region.

In conventional DFB and DBR lasers, light is removed through an end facet and the output beams have dimensions entirely controlled by the vertical (i.e., normal to the surface) (x) and lateral (y) size and the composition of the guiding structure. Such output beams typically have a large asymmetry in the beam divergence for effective coupling to optical fibers using spherical lenses, or for other applications requiring beams with low divergence angles.

Near field beam dimensions (in at least one direction) larger than that available from laser facets may be obtained by using a Bragg grating to couple light out of the waveguide normal (or at certain fixed angles) to the waveguide surface. So called second order Bragg gratings have a period equal to the wavelength of light of the guided mode. The second grating order of such a grating reflects some of the light back in the waveguide plane while the first order couples some of the light out of the waveguide in a direction normal to the plane. So called first order (Bragg) gratings have a period equal to one half the wavelength of light in the guided mode, reflect light in the waveguide plane, and do not couple light out of the waveguide. First, second, and third order (etc.) gratings are sometimes referred to as being in resonance. A non-resonant grating couples light out of the waveguide at an angle to the normal and does not reflect any light in the waveguide plane.

U.S. Pat. No. 5,970,081 to Hirayama et al. appears to show a laser with a distributed feedback (DFB) grating of second order or higher that claims to obtain a Gaussian shaped output beam by narrowing the waveguide or using a chirped grating at the outcoupling portion. They do not seem to recognize that by so doing the resonant wavelength of the grating is altered along the length of the narrowing or chirping. This would be expected to result in an output which will fan in angle along the longitudinal direction rather than produce a simple Gaussian intensity variation emitted normal to the plane as claimed. They do not define the beam shape in the lateral direction. In all versions they choose second order outcoupling gratings which, absent a narrowing waveguide or chirp, would emit light perpendicular to the surface of the laser waveguide.

U.S. Pat. No. 4,006,432 to Streifer et al. appears to show a grating out-coupled surface emitting DFB laser. The grating period may be chosen to be either resonant or not.

A paper by Bedford, Luo, and Fallahi titled Bow-Tie Surface-Emitting Lasers (IEEE Photonics Technology Letters, Vol. 12, No. 8, August 2000) appears to show a DBR laser with curved second order grating at the ends to couple light out of the waveguide. The same gratings are used for outcoupling and for reflecting the light within the waveguide. They mention the use of non-resonant gratings in conjunction with reflector gratings if emission at other than the direction normal the waveguide plane is desired. The paper appears to show a flared resonator region which allows symmetric outcoupling from both ends of the laser. This facilitates two outputs that are coherent with one another, with emission in the same direction. Such a device is meant to alleviate the complications of controlling the relative phase between the two emitters.

The Tiberio article (Facetless Bragg reflector surface-emitting AlGaAs/GaAs lasers . . . , J. Vac. Sci. Technol., B9(6), 1991) appears to show a surface emitting laser diode that uses first order reflective gratings and either second order (or non-resonant) gratings for outcoupling. Thus, depending on the chosen grating period, the outcoupled beam can be normal or at an angle to the surface.

U.S. Pat. No. 6,064,783 to Congden appears to show a DBR laser with a grating assisted waveguide coupler that couples light from the laser waveguide to a parallel fiber-like glass waveguide for later coupling to a fiber. Several different lasers are coupled to similar fiber-like glass waveguides in the figures. The fiber axis is parallel to the laser waveguides. This reference mentions that this model is easily attached to a fiber through "butt coupling." The grating acts as a Quasi Phase Matching element to couple the light from the laser waveguide to the fiber-like glass waveguide.

The optical and electronic properties of a semiconductor depend on the crystal structure of the device, which has led to investigative work into fabricating artificial structures or superlattices. By tailoring the crystal structure of a device during its fabrication, the optical and electronic properties can be controlled. The crystal structures of such devices may be controlled, for instance, by molecular beam epitaxy (MBE) and metal-organic chemical vapor deposition (MOCVD). Such techniques are capable of monolayer control (~5 angstrom) over the chemical composition of a crystal.

Other commonly used heterostructures are quantum wells, in which a single layer of one semiconductor is sandwiched between two layers of a larger bandgap material. Strain is produced by using an epitaxial layer with a different lattice constant than the substrate. This strain has a dramatic effect on the properties of the optical system. Among other things, it can allow bandgap tunability, reduced threshold current, and improved laser reliability.

Strain can also allow laser emission to have tailored polarization. By using appropriate strain, one can produce light predominantly polarized as TE, or TM.

SUMMARY OF THE INVENTION

The present invention is directed to a chip-scale wavelength division multiplexed (CS WDM) system using grating outcoupled surface emitting lasers. Though the present invention can be embodied in many ways, an example preferred embodiment is summarized as comprising a surface emitting semiconductor laser system having arrayed waveguide grating structures at either end. The arrayed waveguide grating structures at either end couple to a plurality of waveguides, one for each channel or wavelength of the laser system. Each waveguide of this plurality preferably includes a reflector for reflecting one of the wavelengths of the system.

In preferred embodiments, the output signals are modulated by adding shunt waveguides to the central waveguide such that by alternating coupling switches, light is caused to traverse either the central waveguide at the outcoupling aperture, or the shunt waveguide (thus bypassing the outcoupling aperture). In preferred embodiments, the losses from the shunt waveguide are balanced against the losses of the outcoupling aperture so that chirp free modulation can be accomplished.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1A:
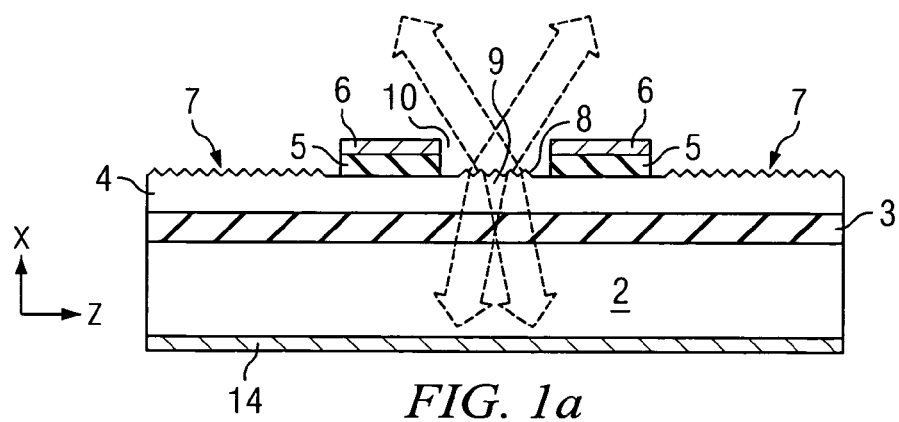
FIG. 1a shows side view of an innovative DBR laser.

The numerous innovative teachings of the present application will be described with particular reference to the presently preferred embodiment (by way of example, and not of limitation).

First order outcoupling gratings and second order or higher outcoupling gratings are both used in at least some embodiments of the present innovations. In the present application, first order DBR refers to a distributed Bragg reflector grating that reflects light within the waveguide in first order for feedback. A second order DBR grating will outcouple light in first order, and feedback light in second order.

In several variations in this application, second order feedback gratings (which couple light out in first order) are used. In such arrangements, the feedback grating depth or strength can be varied in the y and z directions so that both the loss and the feedback from the grating help to stabilize the laser mode, though this is not necessary. For example, the first order lateral mode will be stabilized if the grating strength is varied so that the feedback varies in a Gaussian-like profile. This can be accomplished by forming the grating so that its strength varies as $$1-\exp(-(y/\omega)^2)$$

where y is the direction parallel with the feedback grating surface and perpendicular to the cavity length, with the origin taken to be at the center of the out-coupling grating, and omega is half the y grating dimension.

First order outcoupling gratings are gratings which couple light out of the waveguide plane in first order but may or may not satisfy the in-plane Bragg condition for second or higher order Bragg reflection. Such gratings may be designed to create no second or higher order reflections which feedback into the laser mode. In these variations which use such out-coupling gratings with no in-plane feedback, the gratings cause no destabilizing feedback into the laser mode and are mechanically and electrically isolated from the structure used to form and pump the resonant laser cavity. Thus, the length and position of the output grating can be chosen to suit the needs of the application for which the laser is designed. The grating periods required for outcoupling, with and without in-plane reflections, are summarized in "Surface Emitting Semiconductor Lasers and Arrays," G. A. Evans and J. M. Hammer, Eds., Academic Press, 1993, which is hereby incorporated by reference.

In general, second and higher order feedback gratings can result in some in plane feedback. However, these are less preferred in the context of the present application since such higher order interactions are less efficient.

The outcoupling angle of the gratings in the innovative systems herein disclosed is measured as an angle from the normal to the surface of the outcoupling grating. Resonant outcoupling occurs when the outcoupling grating has a period that is equal to an integer number of wavelengths of the light in the cavity. A grating with period equal to the wavelength of light in the laser cavity will outcouple some light normal to the laser plane and reflect some light in-plane in second order. This means the light exits the grating parallel or nearly parallel to the normal. Outcoupling of light off the normal occurs when the grating is not an integer number of guide wavelengths, and in such a case the light exits the grating at an angle from the normal. This angle depends on the difference between the guide wavelength and the grating period. Varying the wavelength of light or the outcoupling grating period can therefore have great effect on the angle of outcoupled light. The out-coupling grating length, longitudinal position, and the output angles may therefore be chosen over a large range of values. The grating may also be shaped to achieve an output beam of a desired cross section. This is valuable for coupling the output light into fibers of different cross sectional size. All of these "off normal" parameters may be varied without fear of significant mode destabilization or disruption of laser coherence. In the case of exactly or near normal outcoupling, there can be significant in-plane reflection that may (or may not) adversely affect the performance of the laser.

FIG. 1a shows a cross sectional view of a preferred embodiment, taken to show the x-z plane. It should be understood that the features in the several figures may not be to exact scale because of the large differences in dimension between the various structures illustrated.

Layers 3, 4, 5, and 6 are grown on a substrate 2 by known means. Each of these layers may comprise a number of sub-layers. Beneath the substrate is the n contact layer 14. The substrate may comprise a thick layer of n-type semiconductor with a top layer of similar n-type material interposed beneath layer 3. This is frequently called the n-cladding or n-clad. The n-clad will have a refractive index below that of layer 3. Layer 3 is the active and guiding layer usually containing the junction between p- and n-type semiconductor materials. It may comprise, for example, a sequence of one or more barrier layers alternating with quantum well layers. Layer 4 is a p-type clad layer and has lower refractive index than layer 3. Layer 5 may be a multi-layer including a p-clad material chosen to enable good contact to 6 which is the p-metallic contact. Layer 14 provides the other electrical contact for the laser. There are many sequences of possible layers for semiconductor lasers and amplifiers, and the present innovations are not limited to the structures recited here. For example, a structure with a p-type rather than an n-type substrate (and all the necessary alterations to accommodate a change from p- to n-type materials and vice versa) is within the contemplation of the present application.

Gratings 7 are surface relief DBR gratings chosen to reflect light in the +/−z direction to form the laser cavity. (Note that these gratings can be buried structures within the device, and the term "surface relief" does not require the grating be on the surface of the device after processing.) The laser mode will be a standing wave which may be considered to be formed by two waves one flowing in the +z direction, the other in the −z direction. First order DBR gratings are preferred, but second or higher order gratings are also possible. The DBR grating depth and length and the thickness of layer 4 are chosen to provide the desired feedback as known in the art.

The reflector gratings can be given added functionality by varying their grating strength or amplitude in both the y (lateral) direction and the z (cavity) direction. Variation of the grating strength in the lateral direction will impart to the cavity mode light a Gaussian shape, allowing for more of the optical energy of the emitted light to be coupled into a circular mode, such as a fiber. Variation of the grating strength in the z direction can improve the suppression of unwanted longitudinal modes on either side of the desired longitudinal mode. the degree to which the unwanted modes are suppressed is called the side-mode suppression ratio.

The outcoupling grating 8 (sometimes referred to herein as OC grating, or OCG) is a surface relief grating with period chosen to couple light at desired angles from the grating plane. It is located at an aperture on the surface of the device. In a preferred embodiment, the outcoupling gratings are about 10 microns wide. The outcoupling grating may be shaped to control the shape of the emitted beam. The grating depth and thickness of the p-clad layer 9 in the vicinity of the grating 8 are chosen to provide the desired degree of outcoupling and to control beam shape. A window or aperture 10 in layers 5 and 6 is provided to allow unobstructed emission of light, and the size and shape of the outcoupling grating is matched to the mode of the fiber to which it couples light (in one embodiment). Because of the two standing waves in the cavity and reflection from the grating, the outcoupling grating simultaneously emits four different light beams, two above and two below the grating plane. These are depicted by dashed arrows. In the case of normal outcoupling of the laser light, the two top lobes are combined into a single beam, as are the two bottom lobes of emitted light.

In one embodiment, the outcoupled light is emitted normal to the surface, since one primary goal is to couple this light into a fiber. When light is emitted normal to the surface, the two top emitted beams are combined into a single beam, and likewise with the downward emitted beams.

Off normal emissions and slightly off normal emissions are also very useful. For example, changing the angle of entry to a fiber by several degrees has minimal impact on the coupling efficiency yet allows the use of an off resonance grating which minimizes undesired feedback into the laser. A larger angle might be desirable to send light to another detector to monitor the laser.

Figure 1B:
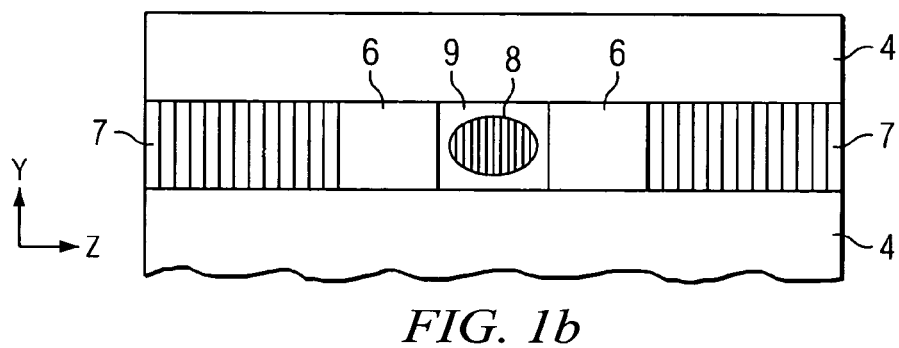
FIG. 1b shows a top view of an innovative DBR laser.

FIG. 1b shows a top view of a single grating outcoupled DBR laser. The outcoupling grating 8 is located at an outcoupling aperture within the envelop of the gain region. On either end of the laser are located distributed Bragg reflectors 7 for providing feedback into the cavity. Of course, cleaved facets may also be used instead of reflector gratings, with highly reflective coatings applied to reflect the light, as shown in later embodiments. With either DBR reflectors or coated facets, the reflectivity of one or both ends can be varied to allow light to escape the cavity for other purposes.

Another embodiment will be discussed with reference to FIGS. 2a and 2b. In this variation, crossed out-coupling gratings are located within the cavities of two (or more) semiconductor lasers arranged at angles to one another and located on a common substrate. In one embodiment, two lasers are used and are positioned at 90 degrees from one another, but more lasers are of course possible—see FIG. 7a for example. The shape and strength of the two gratings are chosen to produce desirable properties in the out-coupled light. Their periods are individually chosen to suit the desired application, such as to control outcoupling angle, or to couple out different wavelengths.

Figure 2A:
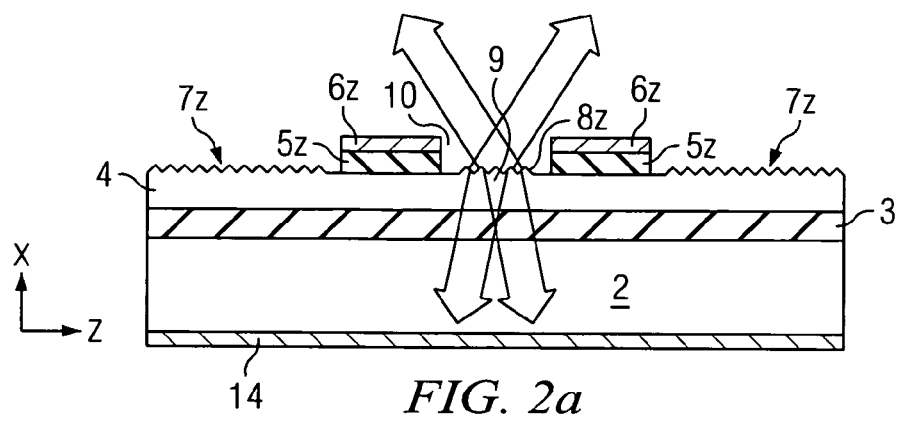
FIG. 2a shows a side view of crossed DBR lasers.

FIG. 2a shows a side view of the crossed grating outcoupled DBR lasers. The structure when seen from the side is similar to that of FIG. 1. Elements that are unique to the laser running in the z-direction are labeled with a z suffix, and elements unique to the laser running in the y-direction are labeled with a y suffix.

Figure 2B:
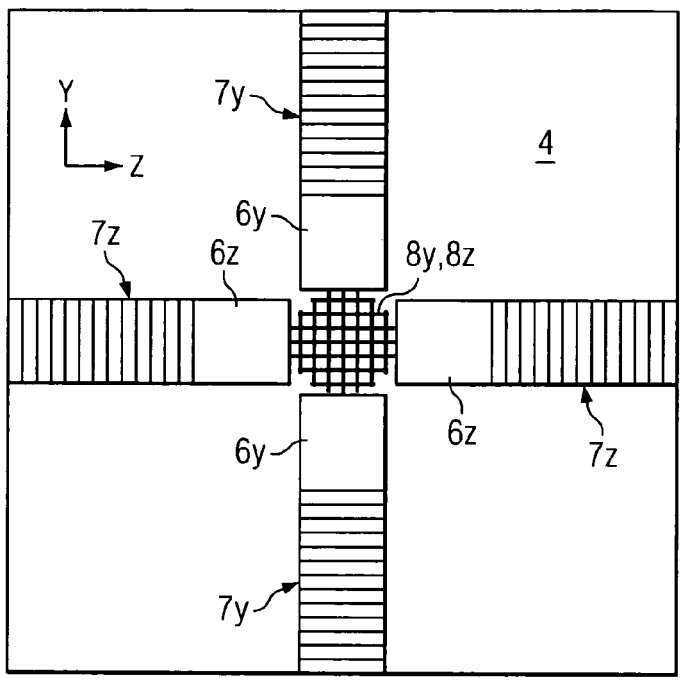
FIG. 2b shows a top view of crossed DBR lasers.

Referring to FIG. 2b, a top view, two crossed DBR lasers are at 90 degrees to one another. Each laser has its own set of reflector gratings 7y, 7z at either end, and both lasers have their own out-coupling grating 8y, 8z positioned at a common location between the reflector gratings. (In the preferred embodiment, the outcoupling aperture is located at the center of the laser, but this is not necessary.) On either side of the out-coupling gratings are the pumped regions of the lasers. (Note that in this variation, the two gain regions of a single laser are discontinuous, having different parts on either side of the outcoupling grating. Other possible embodiments include a single gain region with an outcoupling grating outside the gain region but between the reflector gratings, or even a single continuous gain region that spans the outcoupling grating, having portions on both sides.) The two out-coupling gratings are located at the same place, and the superposition of the two gratings forms a virtual grating with an effective period at an angle of about 45 degrees if the grating periods are about the same fore each laser.

The reflector grating periods are chosen to internally reflect the proper wavelength of light. The reflectivity of the DBR is very high at the Bragg condition, and drops off rapidly when the wavelength is different than the Bragg condition wavelength. This allows the wavelength of the output light to be controlled by controlling the period of the DBR gratings.

Referring again to FIG. 2a, in the case of crossed lasers, a cross section taken parallel to the x-y plane would be similar with layers noted with y subscripts in place of z subscripts.

Gratings 8y and 8z are surface relief outcoupling gratings with periods chosen to couple light at desired angles relative to the grating (y-z) plane. As shown in the figure, the gratings can be shaped to control the profile of the out-coupled beam. A circular profile for the grating is indicated (a more complicated profile would be optimal for fiber coupling), but any other useful shape can be produced, depending on the application. The grating depth along with the thicknesses and compositions of the epitaxial structure of the laser are chosen to provide the desired degree of out-coupling.

For each laser, four beams are emitted because of the left and right running waves that form the standing wave mode of the laser (unless the light is outcoupled perpendicular to the device). Two beams symmetrically angled around the normal will emerge above the grating plane and pass through the window 10. Similarly, two beams will be directed towards the substrate below. (Note the epi layers are transparent and this transparency can be made use of to couple light out through the bottom of the device. In such a case, a reflector is placed on the top of the device to direct the top emitted light back into the laser or out the bottom.) In some designs, the grating may be blazed to allow light to be outcoupled to the right or left of normal as well.

When two or more lasers are combined in this way, the two beams of light will be polarized at 90 degrees with respect to one another. Coupling light into a fiber with two orthogonal polarizations is highly desirable for pumping Raman amplifiers.

Figure 2C:
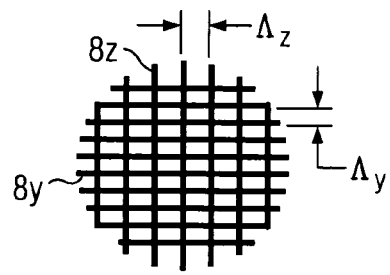
FIG. 2c shows a close up of crossed outcoupling gratings.

FIG. 2c shows a close up of the outcoupling gratings of FIGS. 2a and 2b. The periods, Ly and Lz, of the superimposed two gratings need not be identical. The OCG periods will depend both on the wavelength of light in the cavity (which in turn depends on the periods of the DBR gratings at either end of the cavity) and on the desired outcoupling angle for the emitted beam. By choosing the two gratings to have different OC angles, spatial separation is possible, as may be desired by particular applications. In still another embodiment, the laser light from the devices is emitted normal to the surface, so that both wavelengths of light can be coupled into a fiber through the same aperture or location on the device.

By choosing a non-resonant spacing for the outcoupling grating period (i.e., a distance between grating lines that is not an integer multiple of the wavelength of light within the cavity) the output beams are emitted non-normal to the surface. This is useful in applications where, for example, the fiber into which the light is to be coupled is at an angle relative to the out-coupling grating.

The choice of normal or off normal outcoupling angles can have other advantages. For example, when two or more different wavelengths of light are coupled out of the OC gratings, all wavelengths can be coupled into the same fiber or separated as desired by varying the output angles of the individual gratings. For example, the individual outcoupling gratings for two crossed devices could each couple different wavelengths of light out normal to the surface to couple two different wavelengths into a single fiber mode. This is particularly applicable in the crossed grating out-coupled lasers, discussed further below. If, for some reason, only one wavelength is needed in the fiber, the light from the other device can be emitted off normal so as to not couple into the fiber. The non fiber coupled light could be deflected to a detector, for example. Regardless of the particular use, the choice of outcoupling angles is an advantage to a laser device, and the present application shows how different wavelengths from different sources can be selectively combined into a single region for coupling, or separated into different regions.

The shape and strength (i.e., the depth) of the OC gratings are chosen to produce desirable properties in the out-coupled light. The periods of all OC gratings can be individually chosen according to the needs of that particular laser and the application. For example, the two crossed OC gratings of FIG. 2b can be chosen to outcouple different wavelengths of light, allowing the two lasers of the crossed laser configuration to have different wavelengths, one in the z-direction, another in the y-direction. This of course extrapolates to higher numbers of lasers. Additionally, the two outcoupling gratings (and the different laser diodes themselves) can be chosen to emit the same wavelengths (for example, by making their feedback grating periods the same) allowing additional power and polarization variety in the outcoupled beam(s).

The basic idea can be extended to include a multiplicity of lasers radially arranged around a set of gratings oriented to outcouple light independently for each laser. This allows many wavelengths of light to be generated by merely choosing a different period for the pair of DBRs for each individual laser. The OC gratings can couple this light into a single spatial region (for example, to couple several wavelengths of light into a fiber for DWDM applications), or it can couple the different wavelengths out of the devices at different angles.

Referring still to FIG. 2b, which shows crossed lasers according to a preferred embodiment, if the Bragg reflector gratings are chosen to have the same period in both the y-direction laser and the z-direction laser so that both lasers operate at the same wavelength, and if the crossed OC grating period Lz is the same as Ly, the superposition of the two gratings at right angles results in a virtual grating with an effective period angle of about 45 degrees (if both grating periods are the same). In this case the possible coupling between the y and z lasers can be avoided if the gain regions use quantum wells with compressive strain and thus favor TE mode operation. The virtual grating at 45 degrees will not efficiently reflect TE modes and therefore will not couple the y and z lasers. On the other hand, the use of tensile strain in the quantum well favors TM modes, and may result in enough coupling to either lock the y and z lasers together into a single coherent source, or provide significant crosstalk and other interactions between the two lasers. Thus, the disclosed approach can choose the nature of the output beams to be either a combined single frequency coherent source, or two output beams with two independent wavelengths, or two beams with independent wavelengths but with a controlled amount of cross-talk between them.

The reflector grating periods for the pair of lasers can be the same, which provides additional power and polarization variety. Alternatively, the grating periods can be different, resulting in two different wavelengths of light being outcoupled. This latter configuration can couple light of different wavelengths out at the same angle for coupling light of different wavelengths into the same fiber, saving the cost of implementing a combiner for this function. For example, if the two lasers have different feedback grating periods, they will each generate a different wavelength of light. But both lasers can emit their light normal to the surface of their respective outcoupling grating by choosing each individual outcoupling grating to couple the necessary wavelength of light out normal to the surface.

The size of the grating output aperture can be adjusted for optimum coupling to single or to multi-mode fiber. Likewise, the efficiency of the output element (be it a grating or other element, such as a beam splitter or holographic optical element) can be adjusted by adding a layer of dielectric material to the outcoupling region. If outcoupling efficiency is too high, a high threshold current is required to lase because of the quantity of photons escaping the cavity. With a reflective layer atop the outcoupling grating, a portion of the reflected light is coupled by the grating back into the laser cavity and continues to oscillate within the cavity. This has the effect of marginally decreasing the required current for lasing. The remainder of the reflected light is directed to the surface opposite the reflector and is outcoupled from that surface(to which an anti- or partially-reflective coating can be applied. Adding a dielectric layer (for example, nitride, or a dielectric stack, or even a reflective metallic layer) to the outcoupling location therefore controls outcoupling loss and decreases the required threshold current.

In any configuration of the present application where one or more gratings are located and superimposed on one another, the separate gratings can be individually formed by conventional means (including multiple exposures and etches to form the pattern) or can be merged into a single element using a holographic optical element (HOE). The optical requirements of the gratings can be calculated, and a HOE can be designed that accomplishes these required optical functions. Once designed, such a HOE can be patterned for lithography, and can therefore be fabricated in fewer process steps than it would take to create the multiple gratings separately. For example, multiple divergent beams can be captured and coupled into a single fiber with HOEs.

Figure 3:
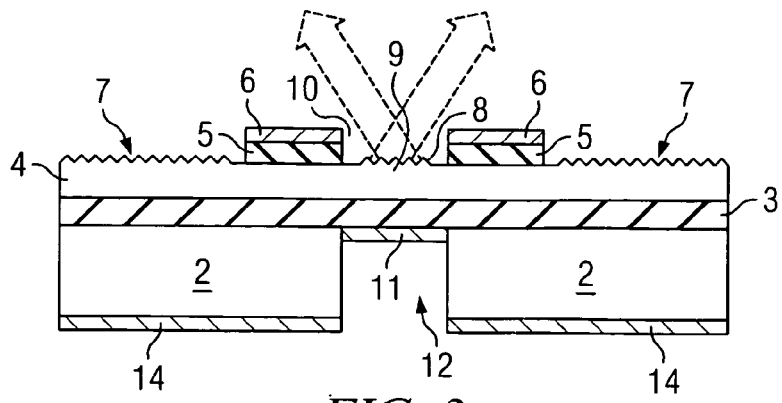
FIG. 3 shows a side view of a DBR laser with a reflective undercoating to reflect laser light.

In another embodiment, shown in FIG. 3, a reflecting surface is placed beneath the outcoupling gratings. This surface 11 reflects the two lower lobes of emitted light. This reflective layer can be made from a metallic substance or other material reflective to the necessary wavelengths of light, or it might be a reflective grating formed in the device, for example. By coupling the lower lobes back up and out of the OC grating, greater power is coupled out of the laser and may be captured by a fiber or other device, such as a detector to monitor the light produced by the device. A space 12 is shown in the substrate of the figure, but the same reflective surface can be placed with the substrate intact.

Figure 4A:
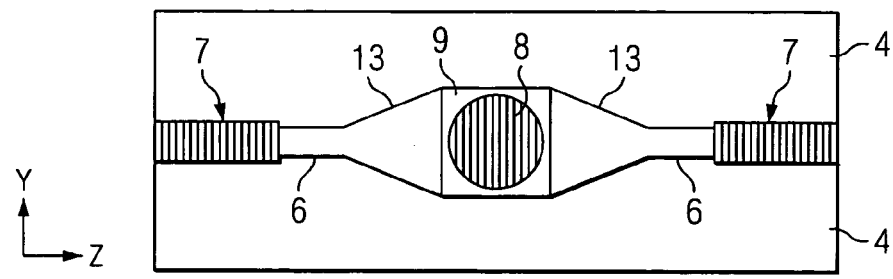
FIG. 4a shows a top view of a DBR with flared or tapering gain regions.

Another embodiment is shown in FIG. 4a, which shows a method to increase the lateral width of the gain regions at the outcoupling grating while maintaining a single-transverse mode. This is accomplished by using a single mode waveguide in the gain region that connects to a tapered gain region. The taper angle is related to the divergence of the fundamental mode of the single mode waveguide. In the preferred embodiment, the tapered regions have a laterally varying current contact, such as a Gaussian contact to stabilize the modes in the tapered device.

The embodiment shown in FIG. 4a has a tapered gain region 13. The gain region in this sample has a straight portion as well. Different contacts are used in the preferred embodiment, pumping the different regions with increasing current as necessary. The tapered gain region ensures a wide-spatially-coherent mode, and avoids the restriction on the lateral (y) dimension imposed by the requirement of single lateral mode operation. A wide lateral mode allows the width of the output beam to be set by the width of the grating. The grating area can take a desired shape to match the needs of various applications. For example, circular, elliptical, or Gaussian beams can be produced.

Figure 4B:
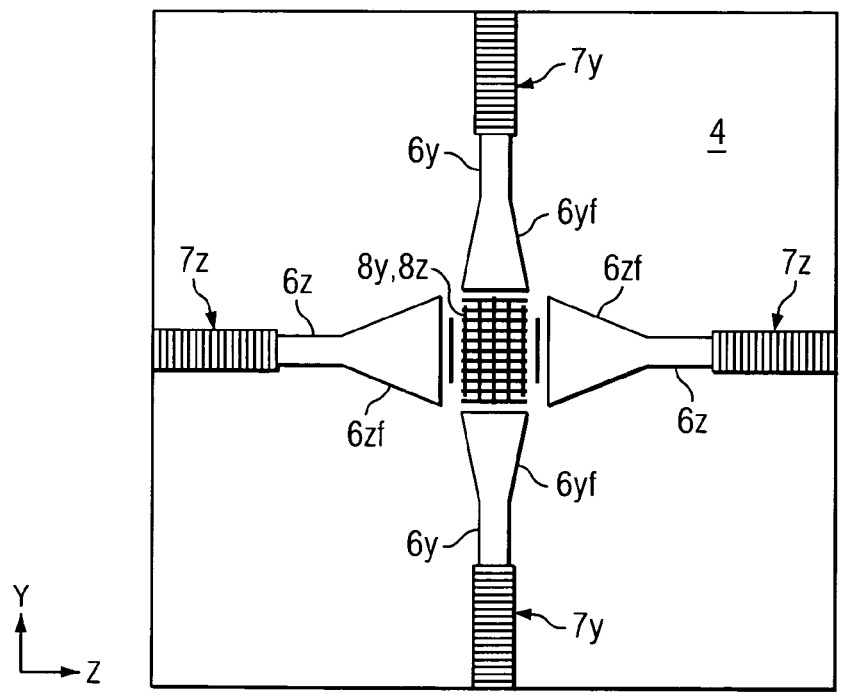
FIG. 4b shows a top view of crossed DBRs each with flared or tapered gain regions.

FIG. 4b shows the tapered gain regions used with multiple crossed grating outcoupled lasers. This embodiment shows two crossed GO (grating outcoupled) lasers at 90 degrees to one another. DBR gratings $7y$, $7z$, create the cavity as in other embodiments discussed above. The pumped regions of the lasers in this variation have a flared section (labeled with the f suffix), being wider closer to the OC gratings. In this example, one laser has an outcoupling grating that is circular in shape, while the other laser has an outcoupling grating that is rectangular. Using a tapered gain region, outcoupled beams of a greater range of sizes can be produced, as the gain region can be made to whatever width is necessary to accommodate (or fully take advantage of) the size of the OC grating. Tapered gain regions also increase the total amount of emitted power from the device.

Figure 5A:
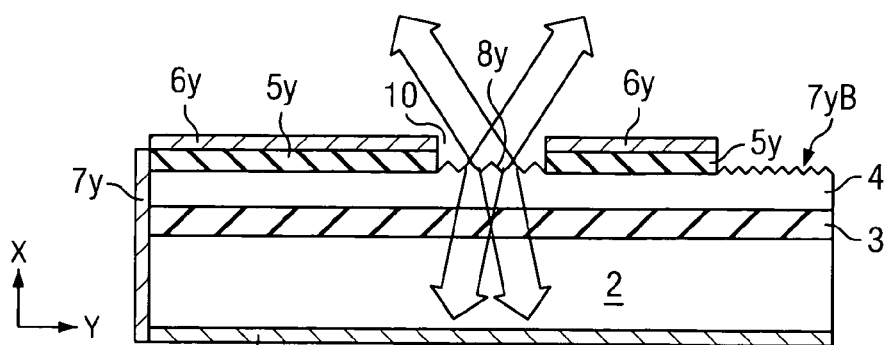
FIG. 5a shows a side view of a laser diode having a DBR at one end and a cleaved facet at the other end.

Another embodiment is shown in FIG. 5a. At one end of the laser, the DBR has been replaced by a reflective end facet $7y$. There are still two gain region portions, separated by the OC grating in this embodiment. The other end of the laser has a DBR $7y$B, the period of which determines the wavelength that will be stable in the cavity.

Figure 5B:
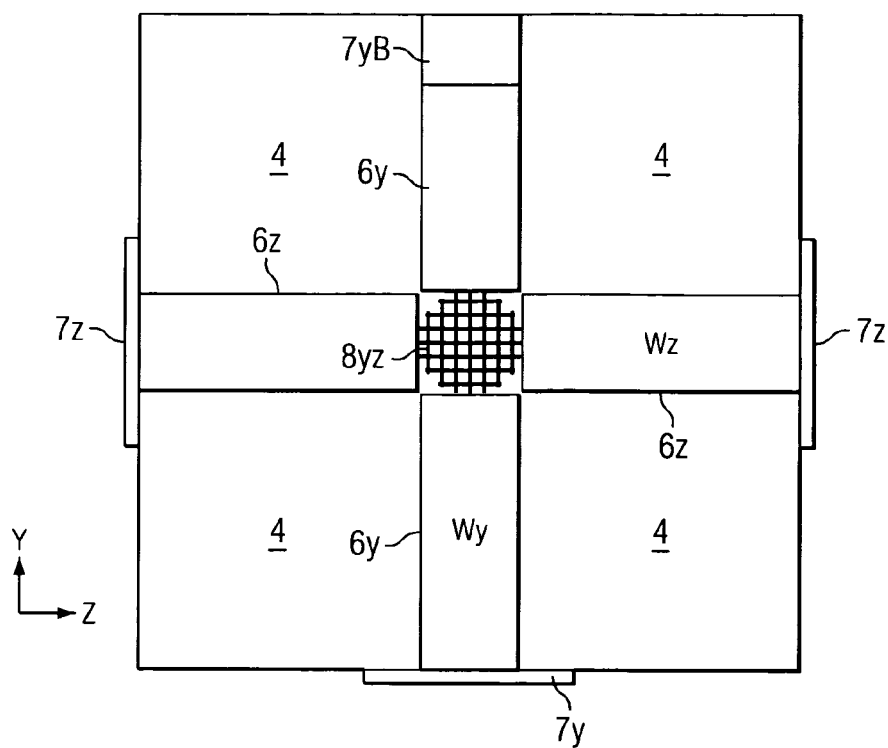
FIG. 5b shows a top view of crossed lasers, using both DBRs and reflecting facets.

A top view of a crossed GO laser system is shown in FIG. 5b. In this variation, the laser running in the z-direction (horizontal in the figure) has reflective end facets on both ends, and no DBRs for reflecting the light in the cavity. The y-direction laser (vertical in the figure) has a DBR at one end, and a reflective facet at the other end. Cleaved facet ends reduce the length of the device since the length of the DBR sections is omitted.

Figure 5C:
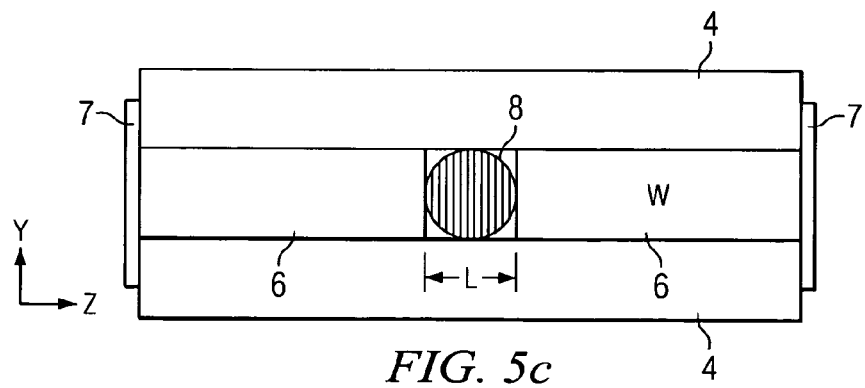
FIG. 5c shows a top view of a laser diode using cleaved facets.

FIG. 5c shows a top view of a laser diode with cleaved facets at both ends. The length of the gain region is fixed by the reflectivity of the end facets or the DBRs.

Figure 6:
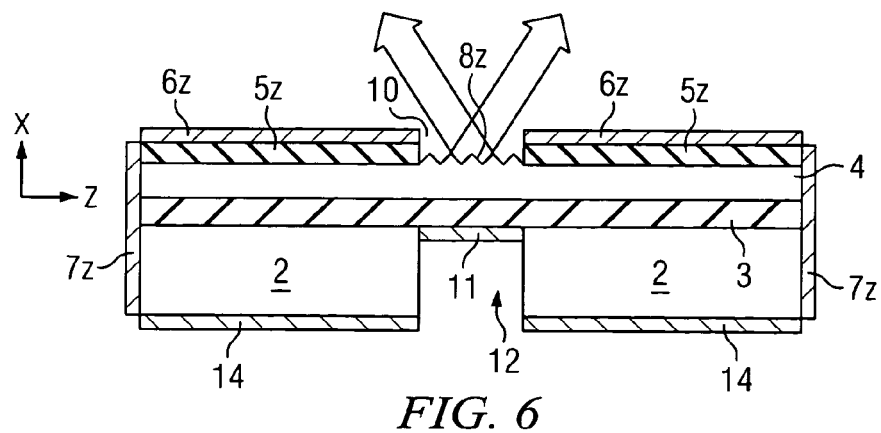
FIG. 6 shows a laser diode using cleaved facets and a reflective layer beneath part of the waveguide.

FIG. 6 shows a laser with two reflective end facets and an OC grating between the pumped regions. Beneath the OC grating is a reflector for reflecting the two downward directed beams back up toward the surface of the laser. Capturing the downward beams is useful to increase efficiency.

Figure 7:
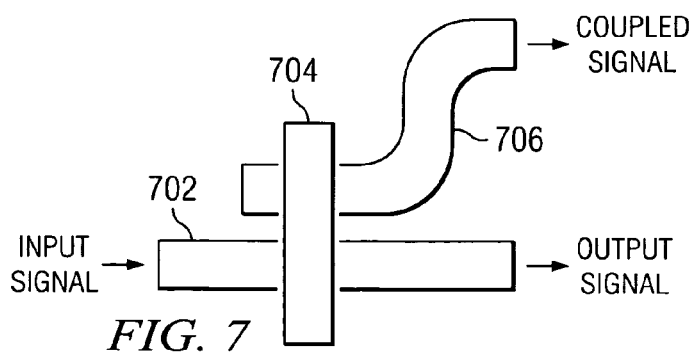
FIG. 7 shows a switch consistent with a preferred embodiment of the present invention.

FIG. 7 shows an example of a fundamental waveguide switch according to a preferred embodiment. This example switch 704 transfers the input optical signal from the main horizontal waveguide 702 to the upper waveguide 706 with the switched signal following the optical circuit of the system (e.g., resonance within a cavity formed between two reflectors). If the switch is not activated, the input signal will continue along the main horizontal waveguide 702. In order to switch the power, a preferred embodiment uses the quantum confined Stark effect (QCSE) because it provides a large refractive index change in a very short time and is compatible with the epitaxial material used in the GSE laser.

Figure 10:
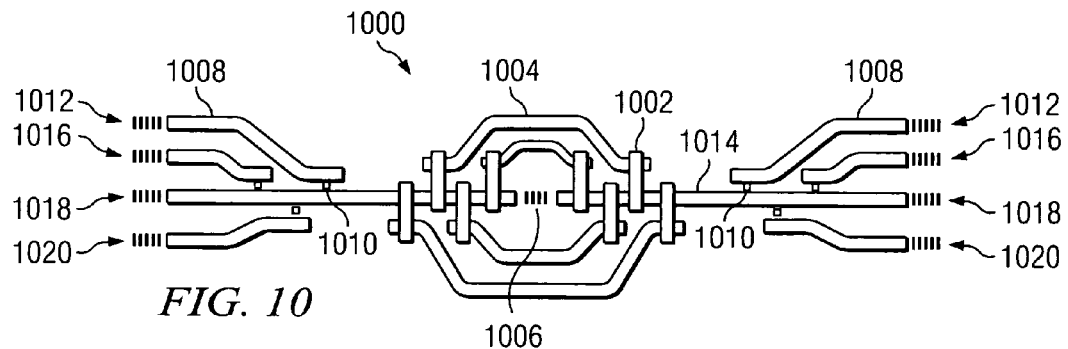
FIG. 10 shows a system including alternate waveguides coupled to a central waveguide, with a modulation system in place according to a preferred embodiment.

Semiconductor lasers can be modulated using current injection at data rates as high as 40 Gbps, though wavelength chirp can be a serious limitation by increasing pulse spreading and limiting the data rate. The innovative concept herein for an integrated GSE modulator allows electrical switching of light from the waveguide under the outcoupler to an adjacent shunting waveguide. An example of this system is shown in FIG. 10, described below. If the losses in the shunt waveguide balance the losses from the grating outcoupler, the photon density in the GSE laser remains constant allowing chirp-free modulation at rates well in excess of 40 Gbps.

Two types of waveguide switch can be used to transfer light from one waveguide to another, for example, in the modulators described further below. The two types of preferred switches include parallel dielectric waveguides in close proximity and grating assisted coupling of parallel dielectric waveguides in close proximity.

Parallel waveguides in close proximity are the most common couplers found in microwave and optical systems. However, there are two major disadvantages of using these switches. First, coupling between the waveguides is small when the two waveguides are not identical. Second, the coupling is not sufficiently wavelength sensitive and therefore not useful for WDM systems. Grating coupled waveguides offer the best design characteristics for WDM systems because they are wavelength selective.

A directional coupler is formed by bringing two widely separated independent waveguides into close proximity over a limited distance. When the two waveguides are so close that their fields begin to overlap, light from one waveguide will couple to the other. From a theoretical standpoint, two parallel waveguides form a complex single waveguide system where the optical modes become super modes that have power distributed over the space (vertical and lateral) occupied by the two "subwaveguides." To concentrate power in only one of the subwaveguides requires a distribution of power over the various super modes. When the waveguide system is passive and without losses, the power distribution of the various modes is unchanged with propagation distance. Because the various super modes have different propagation constants, the spatial concentration of power is periodically exchanged between the two subwaveguides. Hence, the concept of switching or coupling of power between the two subwaveguides is in reality the propagation of two independent waveguide modes that periodically sum to different spatial distributional along the axial propagation direction.

FIG. 10 shows an example embodiment implementing the innovative modulation system. In this example, the device includes a GSE laser system 1000 with at least two integrated optical switches 1002 and a shunt waveguide 1004 that bypasses the outcoupler 1006, providing a different path in which the light can resonate without an outcoupling aperture. The switches 1002 are preferably contained in the lasing cavity. When the switches 1002 are activated by applying a voltage, light bypasses the outcoupler 1006. Switching from one state to another allows modulation of the output signal. Typical switching voltages are on the order of 5 to 20 volts, depending on the design.

This example embodiment of FIG. 10 also depicts multiple cavities created by adding waveguide sections 1008 at either end of the system 1000. The added waveguide sections 1008 include DBRs 1012 that reflect light of a particular wavelength within the cavity, the cavity including two end sections of waveguide 1008 and central waveguide 1014 to couple light out at aperture 1006. The DBRs 1012 at either end of this cavity are reflective at a wavelength particular to that cavity, and other DBRs 1016–1020 are reflective at other wavelengths, such that each cavity resonates with a different wavelength. Multiple added waveguide sections of this kind can be added, each with a different period DBR to reflect a different wavelength, thus providing a multi-wavelength source, with all wavelengths coupled out the same aperture 1006. Added waveguide section 1008 can be coupled to the main waveguide 1014 using grating assist coupling, for example. Other means of coupling the light between waveguides are also consistent with the present innovations.

Figure 8:
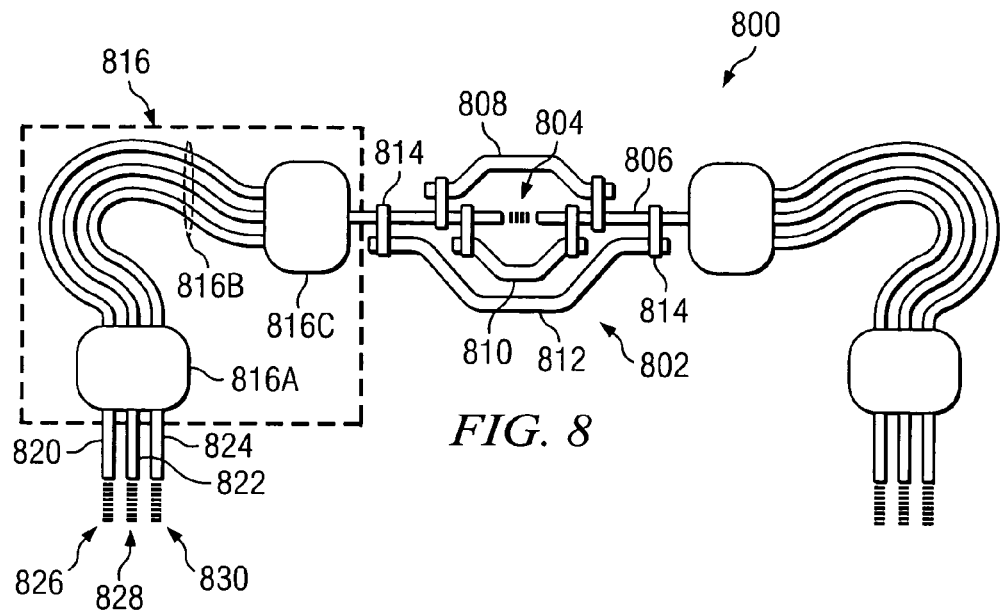
FIG. 8 shows an arrayed waveguide system consistent with a preferred embodiment of the present invention.

FIG. 8 shows an example implementation of a preferred embodiment. This example shows a chip scale wavelength division multiplexed system using grating outcoupled surface emitting lasers that outcouple light of multiple wavelengths or channels from a single aperture. This embodiment includes modulators for each independent wavelength of the system (which can vary depending on the needed implementation). The arrayed waveguide used in an example embodiment are used to define cavities with appropriate wavelength selective Distributed Bragg Reflectors (DBRs) on each end of a common waveguide.

FIG. 8 shows the grating outcoupled surface emitting laser system 800 using an arrayed waveguide grating (AWG) to combine and separate different wavelengths of light. The system 800 is based on a grating outcoupled surface-emitting laser 802 that has a central outcoupling grating 804 for coupling light out of waveguide 806. In a preferred embodiment, waveguide 806 has voltage controlled wavelength selective switches 814 that are capable of directing light out of waveguide 806 and into a bypass waveguide 808, 810, or 812 depending on the wavelength of light. An example switch 814 is described with reference to FIG. 7, above.

At either end of waveguide 806 are arrayed waveguide grating structures 816. These structures each preferably include input/output slab waveguide 816A, arrayed waveguides 816B, and combiner 816C. When light from each individual cavity (formed partly by waveguides 820, 822, and 824 at either end) enters the AWG structure 816, the input light is spread by diffraction at the input slab waveguide 816A and input to the arrayed waveguides 816B. At that point, each of the arrayed waveguides 816B includes all wavelengths of light—in other words, the input light from a given cavity is not kept separate, but mixed with the other wavelengths of light from the different reflectivity cavities. The light in arrayed waveguides 816B passes through combiner 816C and into central waveguide 806, where it is coupled out of the system via aperture 804 or modulated by activating a switch (e.g., 814).

In the reverse direction, light passes from waveguide 806 into combiner 816C which separates the light into the multiple arrayed waveguides 816B. After passing through the arrayed waveguides 816B, the light reaches the input/output slab waveguide 816A and is separated by diffraction. Due to the mutual interference between the signals from each waveguide, all the wavefronts are diffracted a different amount and in a different direction, depending on the wavelength. Accordingly, the different wavelengths of light are focused at different positions on the input/output slab waveguide 816A, so that by positioning an output waveguide at each of these positions, each of the individual wavelengths is sent to a different output waveguides 820, 822, 824.

Each of these waveguides 820, 822, 824 includes a DBR 826, 828, 830 (respectively). The DBRs 826, 828, 830 are preferably of different period so as to be reflective of different wavelengths, corresponding to the fabrication of input/output slab waveguide 816A. An identical apparatus is shown in FIG. 8 at the opposite end of waveguide 806.

The waveguides 820, 822, 824 at either end of the system 800 each form part of a different respective cavity. For example, DBR 826 and waveguide 820 form one end of a cavity for a first wavelength, while DBR 828 and waveguide 822 form one end of a cavity for a second wavelength. Analogous parts at the opposite end of system 800 form the opposite ends of these cavities with similar structures, as shown.

Figure 11A:
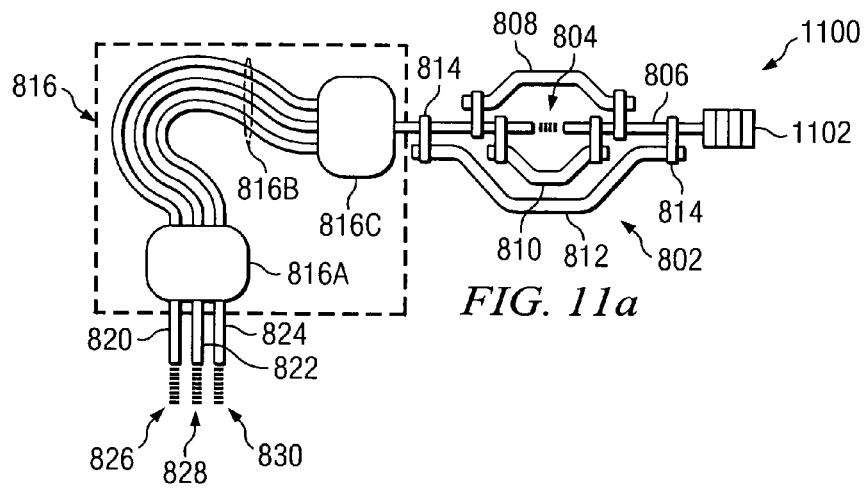
FIGS. 11a and 11b show a preferred embodiment using AWG apparatus.

FIG. 11A shows an alternative embodiment implementing the innovative AWG grating outcoupled surface emitting laser system. In this example, the AWG system is not symmetric about the central waveguide, but employs an AWG apparatus on only one end. At the other end of the central waveguide in this example is a broadband reflector of some kind, for example, a deep, broadly reflective DBR. Modulators can be implemented as in the embodiment of FIG. 8.

In this embodiment, central waveguide 806 is shown with outcoupling aperture 804 and modulator waveguides 808, 810, 812. Switch 814 is used to modulate an output signal, as described above with respect to FIG. 8. At one end of this embodiment, arrayed waveguide structure 816 is shown. This structure is also described more fully above. At the other end of the system 1100 is broadband reflector 1102, which in a preferred embodiment comprises a deep distributed Bragg reflector grating that reflects at all wavelengths present in the laser system. Other types of reflector can also be used in this system with the arrayed waveguide structure.

Figure 11B:
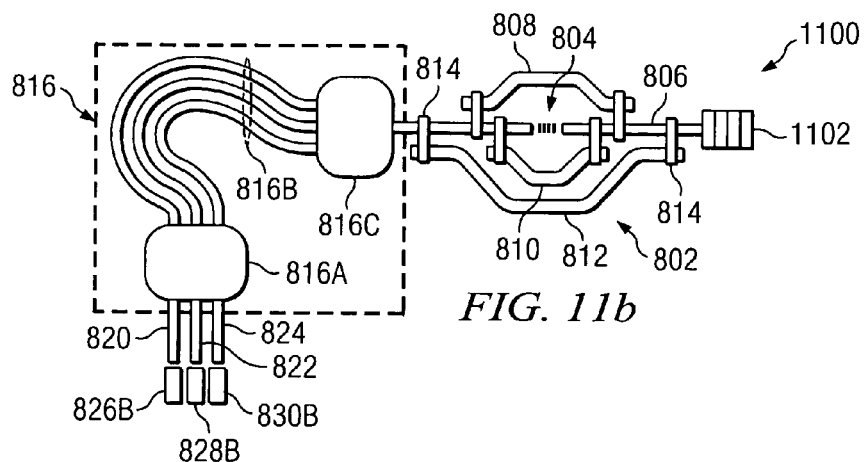

FIG. 11B shows yet another embodiment of the present innovations. In this example, the innovative AWG GSE system 1100 is modified to serve as a chip-scale WDM receiver. The aperture 804 serves as an input aperture for the receiver implementation. Modulators 808, 810, 812 are not required. In this example embodiment, the system is essentially run backward, inputting light through aperture 804, which passes through the AWG apparatus 816 at one end of the central waveguide 806. The AWG apparatus 816 separates the different wavelength signals or channels and passes them into individual waveguides 820, 822, 824 in this example. There are no reflector gratings in the detector implementation. Detectors 826B, 828B, 830B terminate the respective waveguides. Hence, this embodiment allows separation of the WDM signals, the incoming WDM signals being coupled into the system through a single aperture 804.

Figure 12:
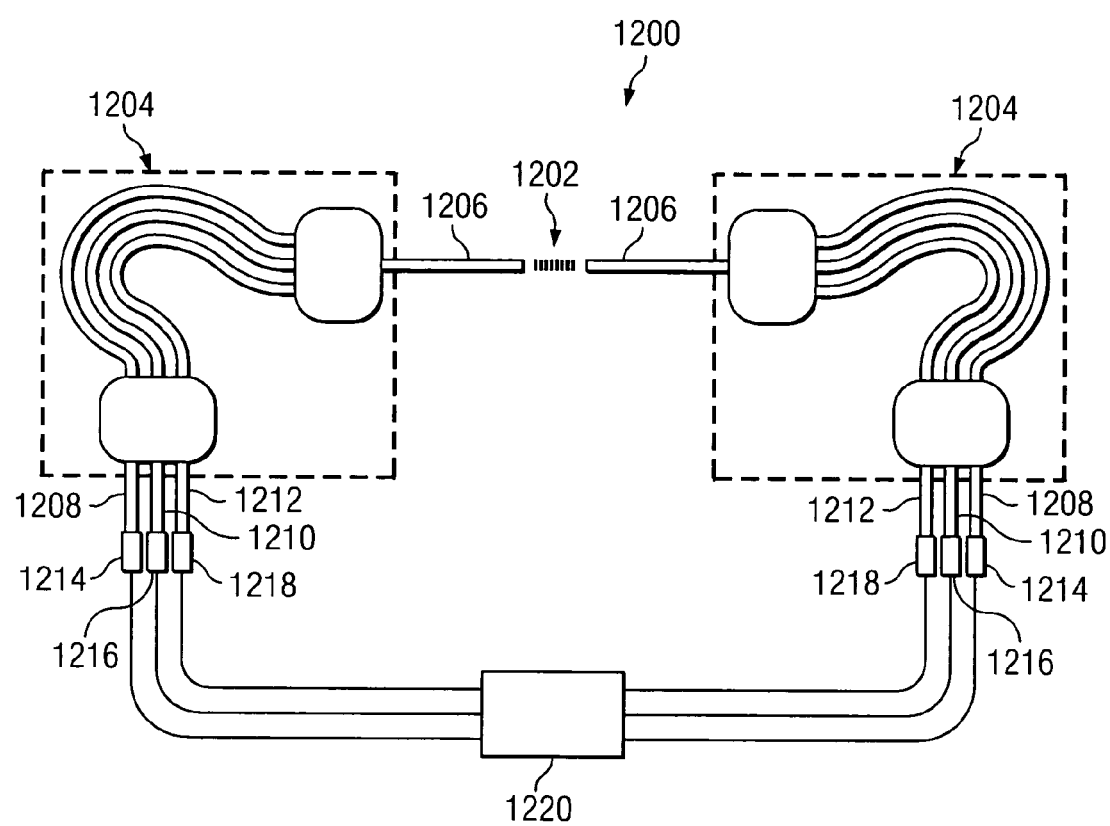
FIG. 12 shows an embodiment wherein the GSE AWG system is used as a receiver.

FIG. 12 shows yet another embodiment of the present innovations. In this example, the innovative AWG GSE system 1200 is again modified to serve as a chip-scale WDM receiver. The aperture 1202 serves as an input aperture for the receiver implementation. In this example embodiment, the system is essentially run backward, inputting light through aperture 1202, which passes through AWG apparatus 1204 at either end of the central waveguide 1206. The AWG apparatus 1204 separates the different wavelength signals or channels and passes them into individual waveguides 1208, 1210, 1212 in this example. The detector pairs 1214, 1216, 1218 terminate the individual waveguides 1208, 1210, 1212. The electrical output from each matched detector pair can be compared electronically with an electronic comparator circuitry 1220 to improve the bit error rate (BER). Hence, this embodiment allows separation of WDM signals, the incoming WDM signals being coupled into the system through a single aperture 1202.

The arrayed waveguide in the preceding discussion is described more fully in several published papers, including "16-*ch Arrayed Waveguide Grating Module with* 100-*GHz Spacing*," by Tsunetoshi Saito et al., published in Furukawa Review, No. 19, 2000, which is hereby incorporated by reference.

Figure 9:
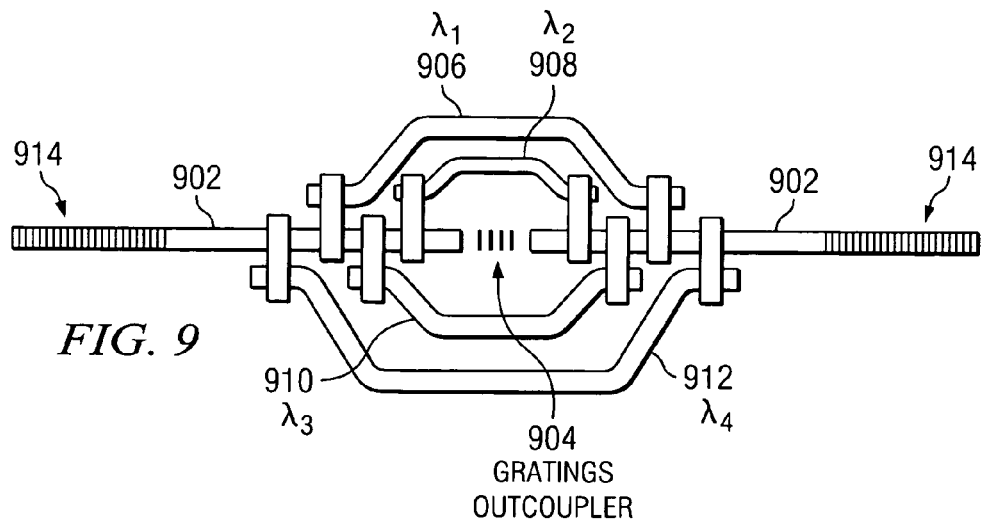
FIG. 9 shows a modulated system including multiply resonant DBRs at either end.

FIG. 9 shows another example embodiment of the present innovations. In this example, a central waveguide 902 includes an outcoupling aperture 904 and DBRs 914 at either end. Coupled to waveguide 902 are modulators 906-912 which include sections of waveguide and wavelength selective switches that couple the sections of waveguide to central waveguide 902. These modulators are comparable to the modulators of FIG. 8.

The DBRs 914 comprise multiply resonant DBR sections. Different sections of DBRs 914 have different periods, so that light in waveguide 902 can include a plurality of wavelengths, each different wavelength or channel having an analogous DBR 914 section that will reflect that particular wavelength back within the cavity. Sampled gratings are an alternative to a series of discrete periods to form the multiple resonance of each end DBR.

The following background publications provide additional detail regarding possible implementations of the disclosed embodiments, and of modifications and variations thereof, and the predictable results of such modifications. All of these publications are hereby incorporated by reference: "Surface Emitting Semiconductor Lasers and Arrays," Ed. Evans and Hammer, Academic Press, 1993; "Research Toward Optical Fiber transmission Systems Part 1," Proc. IEEE, 61, 1703–1751, December 1973; "Optimized Couplers Between Junction lasers and Single Mode Fibers," Hammer, Neil, RCA laboratories, Princeton, N.J., Final Report, 31 Aug. 1981–31 Jan. 1983; "Observations and Theory of High Power Butt Coupling to LiNbO$_3$-type waveguides," Hammer and Neil, IEEE J. Quantum Electronics, QE-18, 1751–1758, October 1982; "Laser Diode End Fire Coupling into Ti:LiNbO$_3$ waveguides," Appl, Optics, 18, 2536–2537, August 1979; "16-ch Arrayed Waveguide Grating Module with 100-GHz Spacing," Tsunetoshi et al., Furukawa Review, No. 19, 2000; "Fabrication of InP-Based Reflection Type Arrayed Waveguide Grating with Metal Coated Reflection Facet," Kim et al., Jpn, J. Appl. Phys. Vol. 40 (2001) pp. L36–37; Part 2, No. IA/B, The Japan Society of Applied Physics, 15, Jan., 2001; "All-optical networks may one day form national backbone," Ramaswami et al., OE Reports Number 188, August 1999; "Crosstalk Reduction of Arrayed Waveguide Gratings by UV trimming of individual waveguides without H$_2$-Loading," Gehler et al., Furukawa Review, No. 22, 2002; C. Dragone, "An NXN Optical Multiplexer Using a Planar Arrangement of Two Star Couplers," IEEE Photonics Technology Letters, Vol. 3, No. 9, September 1991, pp. 812–815. M. K. Smit and C van Dam, "PHASAR-Based WEM-Devices: Principles, Design and Applications," IEEE Journal of Selected Topics in Quantum Electronics, Vol. 2, No. 2, June 1996, pp. 236–250; L. B. Soldano, F. B. Veerman, M.

K. Smit, B. H. Verbeek, A. H. Dubost and E. C. M., Pennings, "Planar Monomode Optical Couplers Based on Mulitmode Interference Effects," Journal of Lightwave Technology, December 1992, pp.1843–1850; H. M. Stoll, "Distributed Bragg Deflector: A Multifunction Integrated Optical Device," Applied Optics, Vol. 17, No. 16, pp. 2562–2569, 15 Aug., 1978; all of which are hereby incorporated by reference.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A surface emitting semiconductor laser system, comprising:
    a first waveguide including semiconductor laser gain material having an outcoupling aperture;
    a first arrayed waveguide grating structure at a first end of the first waveguide, and a second arrayed waveguide grating structure at a second end of the first waveguide;
    wherein the first arrayed waveguide grating structure couples the first end of the first waveguide to a first plurality of waveguides, each waveguide of the first plurality of waveguides including a reflector;
    wherein the second arrayed waveguide grating structure couples the second end of the first waveguide to a second plurality of waveguides, each waveguide of the second plurality of waveguides including a reflector.

2. The system of claim 1, further comprising a second waveguide, a first end of the second waveguide coupled to the first waveguide between the outcoupling aperture and the first arrayed waveguide grating structure by a first switch, a second end of the second waveguide coupled to the first waveguide between the outcoupling aperture and the second arrayed waveguide grating structure by a second switch.

3. The system of claim 2, wherein light in the semiconductor laser system is modulated by altering states of the first and second switches.

4. The system of claim 2, wherein losses of the outcoupling aperture are roughly equal to the losses of the second waveguide such that the photon density in the semiconductor laser system remains roughly constant.

5. The system of claim 1, wherein each reflector of first plurality of waveguides matches a reflector of the second plurality of waveguides, and wherein each reflector of the first plurality of waveguides reflects a different central wavelength.

6. The system of claim 1, wherein the reflectors of the first and second pluralities of waveguides are distributed Bragg reflectors.

7. A method of modulating a signal in a surface emitting semiconductor laser system, comprising the steps of:
    providing a first waveguide including a semiconductor laser gain material having means for reflecting at first and second ends and an outcoupling aperture between the first and second ends;
    coupling a first end of a second waveguide to the first waveguide at a first switch between the first end and the outcoupling aperture;
    coupling a second end of the second waveguide to the first waveguide at a second switch between the second end and the outcoupling aperture;
    wherein altering the states of the first and second switches modulates light coupled out of the outcoupling aperture; and
    wherein the loss of the second waveguide is balanced against the loss of the outcoupling aperture such that the photon density in the laser system remains relatively constant.

8. The system of claim 7, wherein the means for reflecting comprise multiply resonant distributed Bragg reflectors.

9. The system of claim 7, wherein the means for reflecting comprise arrayed waveguide grating structures that couple light from the first waveguide into one of a plurality of waveguides, each waveguide of the plurality having a reflector capable of reflecting a single central wavelength signal of the system.

10. A semiconductor laser system, comprising:
    a first waveguide including semiconductor laser gain material having a first reflector at a first end and a second reflector at a second end;
    an outcoupling aperture positioned between the first and second reflectors;
    a second waveguide connected to the first waveguide on either side of the outcoupling aperture, a first end of the second waveguide being connected to the first waveguide by a first switch, a second end of the second waveguide being connected to the first waveguide by a second switch;
    wherein altering the states of the first and second switches modulates light coupled out of the outcoupling aperture; and
    wherein the first reflector and the second reflector each comprise multiply resonant distributed Bragg reflectors.

11. The system of claim 10, further comprising a third waveguide connected to the first waveguide on either side of the outcoupling aperture, a first end of the third waveguide being connected to the first waveguide by a third switch, a second end of the third waveguide being connected to the first waveguide by a fourth switch.

12. The system of claim 11, wherein the first reflector reflects light of first and second wavelengths, and the second reflector reflects light of the first and the second wavelengths;
    wherein the first and second switches couple light of the first wavelength into the second waveguide;
    wherein the third and fourth switches couple light of the second wavelength into the third waveguide; and
    wherein light of the first wavelength is modulated by altering the states of the first and second switches, and light of the second wavelength is modulated by altering the states of the third and fourth switches.

13. A surface emitting semiconductor laser system, comprising:
    a central waveguide including semiconductor laser gain material having an outcoupling aperture;
    first means for reflecting a plurality of wavelengths coupled to a first end of the central waveguide;
    second means for reflecting the plurality of wavelengths coupled to a second end of the central waveguide;
    wherein for each wavelength of the plurality, there is an alternate waveguide coupled to the central waveguide by a pair of switches, one switch of the pair being positioned on either side of the outcoupling aperture; and wherein each wavelength of light is modulated by altering the states of the switches.

14. The system of claim 13, wherein the first and second means for reflecting the plurality of wavelengths comprise multiply resonant distributed Bragg reflectors.

15. The system of claim 13, wherein the first and second means for reflecting the plurality of wavelengths comprise arrayed waveguide grating structures that couple each of the plurality of wavelengths into a different waveguide, each of the different waveguides having a reflector attached thereto.

16. A surface emitting semiconductor laser system, comprising:
- a first waveguide including a semiconductor laser material having an outcoupling aperture;
- an arrayed waveguide grating structure at a first end of the first waveguide;
- a first reflector at a second end of the first waveguide;
- wherein the arrayed waveguide grating structure couples the first end of the first waveguide to a first plurality of waveguides, each waveguide of the first plurality of waveguides including an associated reflector.

17. The system of claim 16, wherein the first reflector is a deep grating broadband reflector.

18. The system of claim 16, wherein the associated reflectors comprise distributed Bragg reflectors.

19. The system of claim 16, further comprising a second waveguide, a first end of the second waveguide coupled to the first waveguide between the outcoupling aperture and the arrayed waveguide grating structure by a first switch, a second end of the second waveguide coupled to the first waveguide between the outcoupling aperture and the first reflector by a second switch.

20. The system of claim 19, wherein light in the semiconductor laser system is modulated by altering states of the first and second switches.

21. The system of claim 19, wherein losses of the outcoupling aperture are roughly equal to the losses of the second waveguide such that the photon density in the semiconductor laser system remains roughly constant.

* * * * *